(12) United States Patent
Bruno et al.

(10) Patent No.: US 7,187,315 B2
(45) Date of Patent: Mar. 6, 2007

(54) APPARATUS FOR DIGITAL-ANALOG CONVERSION OF A SIGNAL

(75) Inventors: Angela Bruno, Catania (IT); Giovanni Cali', Catania (IT); Antonio Palleschi, Messina (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 11/239,679

(22) Filed: Sep. 29, 2005

(65) Prior Publication Data

US 2006/0071837 A1    Apr. 6, 2006

(30) Foreign Application Priority Data

Sep. 29, 2004   (EP) ................... 04425727

(51) Int. Cl.
*H03M 1/66* (2006.01)
(52) U.S. Cl. ...................... 341/145; 341/144
(58) Field of Classification Search ............... 341/144, 341/145, 118–121
See application file for complete search history.

(56) References Cited

U.S. PATENT DOCUMENTS

| | | | |
|---|---|---|---|
| 5,592,166 A | 1/1997 | Wincn | 341/144 |
| 5,600,321 A | 2/1997 | Wincn | 341/144 |
| 5,631,587 A * | 5/1997 | Co et al. | 327/107 |
| 5,696,512 A | 12/1997 | Takiguchi | 341/144 |
| 5,757,298 A | 5/1998 | Manley et al. | 341/138 |
| 6,570,947 B1 * | 5/2003 | Zipper et al. | 375/376 |
| 6,597,300 B2 * | 7/2003 | Mori | 341/144 |

OTHER PUBLICATIONS

Cong, Y. et al., "A 1.5V 14b 100MS/s Self-Calibrated DAC," in *Proceedings of the IEEE International Solid State Circuits Conference*, Feb. 9, 2003, pp. 1-10.

* cited by examiner

*Primary Examiner*—Brian Young
(74) *Attorney, Agent, or Firm*—Lisa K. Jorgenson; E. Russell Tarleton; Seed IP Law Group PLLC

(57) ABSTRACT

An apparatus for the conversion of a digital input signal into an analog output signal, the apparatus including a first circuit receiving the digital input signal that is representative of the analog output signal and suitable for producing a first signal on an output line, and a second circuit for supplying a second signal on the output line, in response to a further digital signal. The further digital signal is a function of external variables, and the union of the first and second signal on the output line forms the analog output signal.

26 Claims, 3 Drawing Sheets

APPARATUS FOR DIGITAL-ANALOG CONVERSION OF A SIGNAL

BACKGROUND OF THE INVENTION

1. Field of the Invention

The present invention refers to an apparatus for the digital-analog conversion of a signal.

2. Description of the Related Art

Currently we are in the presence of a growing demand, above all in the market of radio communications, for high speed and high resolution digital-analog type converters (DAC), that is converters capable of converting a digital word, normally a word in code, into an analog signal.

An architecture that has been used to produce high speed and high resolution DACs includes an array of current sources. The digital-analog converter receives a digital input word that represents a desired output current and the current sources are selectively switched into an output to provide for the desired output current. Such types of converters have been used above all for driving resistive loads without the need for a voltage buffer.

One problem that troubles such converters lies in the decoupling of the current sources that diminishes the dynamic and static linearity of the converter, produces switching noise (presence of spikes of current in output) and decreases the output dynamics.

Several techniques exist to reduce the decoupling of the current sources in the DACs. One technique is described in D. Groeneveld al. "A Self-Calibration Technique for Monolithic High-Resolution D/A Converters", IEEE Journal of Solid-State Circuits, vol. 24, pp. 1517–1522, December 1989; said technique comprises the use of an additional current source within a subarray that permits the extraction of a current source from the circuit every time for calibration and correction measuring purposes leaving a complete group of current sources available for the normal operations of digital-analog conversion.

The request of an additional current source can, however, degrade the dynamic performance of the converter since the input and output switchings of the current sources on the calibration ratio introduce spurious phenomena at the calibration frequencies in the output spectrum of the converter. In practice these spurious phenomena comprise additional dynamic components coming from dynamic decouplings among the arrays of current sources that are used every time. These dynamic decouplings are not attenuated by the calibration mechanism.

BRIEF SUMMARY OF THE INVENTION

In view of the state of the art described, the disclosed embodiments of the present invention provide an apparatus for the digital-analog conversion of a signal that permits the reduction of noise.

In accordance with one embodiment of the present invention, an apparatus for the conversion of a digital input signal into a analog output signal is provided that includes a first circuit having the digital input signal representative of a desired output signal and suitable for producing a first signal on an output line, and a second circuit suitable for supplying a second signal on the output line in reply to a further digital signal, the further digital signal being a function of external variables, the union of the first and second signals on the output line forming the analog output signal.

In accordance with another embodiment of the invention, a circuit is provided that includes a first circuit having an input to receive a digital input signal and configured to generate a first output signal on an output line; a second circuit having an input to receive a further digital signal and to generate a second output signal on the output line in combination with the first output signal; and a third circuit having an input to receive at least one external signal, such as an external variable signal and to generate the further digital signal.

In accordance with another aspect of the foregoing embodiment, the circuit further comprises a plurality of first current sources coupled to the first circuit and a plurality of second current sources coupled to the second circuit, and further comprising a control circuit configured to generate first control signals to the first current sources to generate the first output signal and to generate second control signals to the second current sources to generate the second output signal that modifies the first output signal to provide a combined output signal.

In accordance with another aspect of the foregoing embodiment, the first circuit comprises a plurality of first switches coupled between respective current sources and the output of the first circuit and a plurality of second switches coupled between the respective current sources and the output of the first circuit and in parallel with a respective first switch, each of the first and second switches having a control terminal to receive the first control signals; and the second circuit comprises a plurality of first switches coupled between the respective current sources and the output of the second circuit and a plurality of second switches coupled between the respective current sources and the output of the second circuit and in parallel with the respective first switches, the plurality of first and second switches in the second circuit having control terminals to receive the second control signals.

In accordance with another embodiment of the invention, a phase-locked loop circuit is provided that includes an oscillator coupled to a phase detector that in turn is coupled to a charge pump, a voltage controlled oscillator coupled to a filter that in turn is coupled to the output of the charge pump; a fractional frequency divider coupled to the voltage controlled oscillator and the phase detector; and a digital-analog converter coupled to the charge pump, the filter, and to the fractional frequency divider, the digital-analog converter comprising: a first circuit having an input to receive a digital input signal and configured to generate a first output signal on an output line; a second circuit having an input to receive a further digital signal and to generate a second output signal on the output line in combination with the first output signal; and a third circuit having an input to receive at least one external variable signal and to generate the further digital signal.

In accordance with another aspect of the foregoing embodiment, the phase-locked loop circuit includes a plurality of first current sources coupled to the first circuit and a plurality of second current sources coupled to the second circuit, and further comprising a control circuit configured to generate first control signals to the first current sources to generate the first output signal and to generate second control signals to the second current sources to generate the second output signal that modifies the first output signal to provide a combined output signal.

In accordance with yet another aspect of the foregoing embodiment, the phase-locked loop circuit includes a plurality of first switches coupled between respective current sources and the output of the first circuit and a plurality of second switches coupled between the respective current sources and the output of the first circuit and in parallel with a respective first switch, each of the first and second switches having a control terminal to receive the first control signals; and the second circuit having a plurality of first switches coupled between the respective current sources and the output of the second circuit and a plurality of second switches coupled between the respective current sources and the output of the second circuit and in parallel with the respective first switches, the plurality of first and second switches in the second circuit having control terminals to receive the second control signals.

Because of the present invention it is possible to produce an apparatus for the digital-analog conversion of a signal that is less affected by noise, above all the noise caused by switching.

BRIEF DESCRIPTION OF THE SEVERAL VIEWS OF THE DRAWING(S)

The characteristics and the advantages of the present invention will appear evident from the following detailed description of an embodiment thereof, illustrated as non-limiting example in the enclosed drawings, in which.

DETAILED DESCRIPTION OF THE INVENTION

Figure 1:
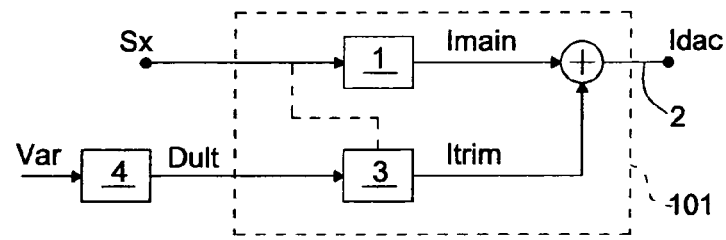
FIG. 1 is a diagram of an apparatus for the digital-analog conversion of a signal in accordance with the present invention.

With reference to FIG. 1 an apparatus according to one embodiment of the present invention for the conversion of a digital signal Sx into a analog signal Idacis is shown. The apparatus includes a converter block 101 having a first circuit block 1 suitable for supplying a current signal Imain on an output line 2 starting from the digital input signal Sx and a second circuit block 3 suitable for supplying a current signal Itrim on the output line 2 in reply to a further digital input signal Dult. The latter is produced by means such as a circuit 4 in response to external input variables Var where with external variables environmental variables are indicated, such as the temperature or variables relating to the particular application in which the apparatus is used as preset values of voltage or of current, and so on. The signal Dult can be formed by an enabling signal En according to a first embodiment of the invention or by a digital correction signal Tx according to a second embodiment of the invention. When the signal Dult is formed by the correction signal Tx, the second circuit block 3 will have as an enabling signal the same enabling signal as the circuit block 1 while if the digital signal Dult is formed by the digital signal En the second circuit block 3 will have in input the same digital signal Sx as the first circuit block 1 and the enabling signal En. The current Itrim is a compensation current generated by the circuit 4 in function of the external variables Var and we have Idac=Imain+Itrim.

Figure 2:
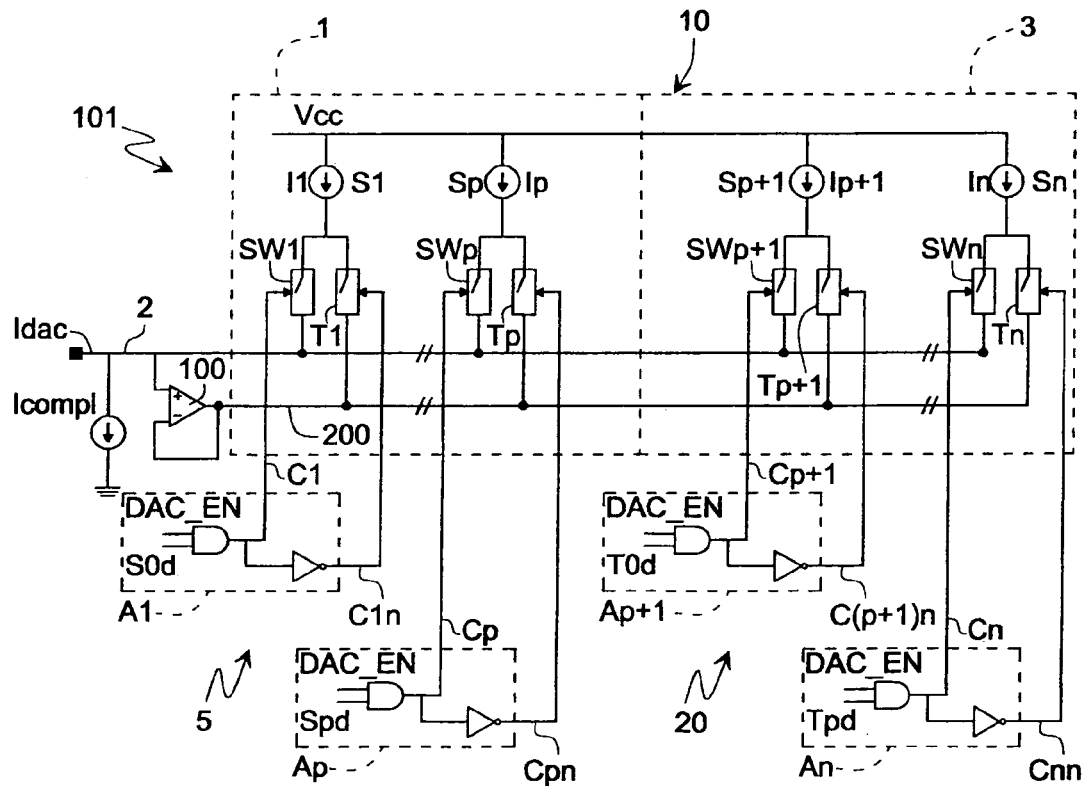
FIG. 2 is a more detailed circuit diagram of the apparatus for the digital-analog conversion of FIG. 1 in the case in which the signal Dult is formed by the signal Tx.
Figure 3:
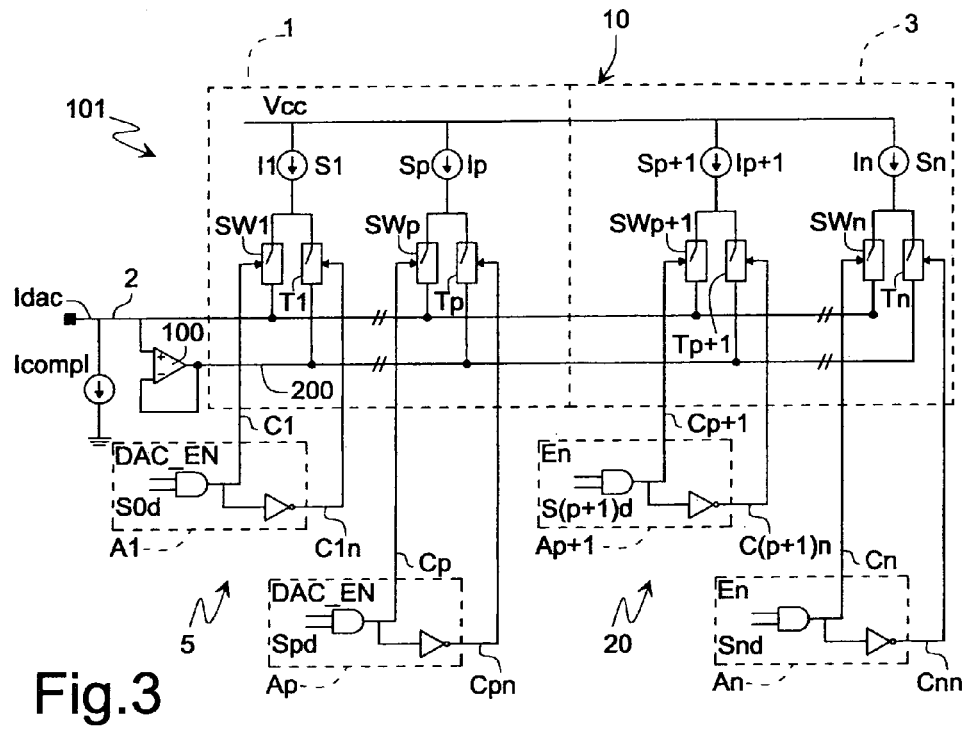
FIG. 3 is a more detailed circuit diagram of the apparatus for the digital-analog conversion of FIG. 1 in the case in which the signal Dult is formed by the signal En.

In FIGS. 2 and 3 the apparatus of FIG. 1 according to the first and second embodiments of the invention is shown in more in detail. In particular, as can be seen in both FIGS. 2 and 3, the first circuit block 1 and the second circuit block 3 have at least one array 10 of sources or current generators S1 . . . Sn that produce respective output currents I1 . . . In and the converter block 101 comprises an array of switches SW1 . . . SWn which are connected to switch the respective outputs of said current sources S1 . . . Sn towards the output line 2 in reply to respective control signals C1 . . . Cn so as to supply an output current Idac on the output line 2. Both the circuit block 1 and the circuit block 3 are weighed in binary mode. The apparatus comprises control means 5 having the input digital signal Sx that is representative of a desired output signal Idac and suitable for sending several C1 . . . Cp of the control signals C1 . . . Cn to the respective switches SW1 . . . SWp to produce a current signal Imain. The current sources S1 . . . Sn are connected to a supply voltage Vcc.

The apparatus of FIGS. 2 and 3 includes further means such as a circuit 20 suitable for producing the control signals Cp . . . Cn for the respective switches SWp . . . SWn in reply to the digital signal Dult to produce the compensation current Itrim. In this manner Idac=Imain+Itrim. The digital signal Dult can be the digital correction signal Tx (FIG. 2) or the digital enabling signal En (FIG. 3).

In the case in which the signal Dult is formed by the digital correction signal Tx, the apparatus of FIG. 2 includes control means such as circuits 5 and 20 constructed with an array of devices A1 . . . An. Each device A1 . . . Ap of the control circuit 5 has a port AND receiving in input the enabling signal DAC_EN and one of the bits S0d . . . Spd of the digital word Sx (in the case in which the digital word Sx has p bits) while each of the devices Ap+1 . . . An of the control circuit 20 has a port AND receiving in input the enabling signal DAC_EN and one of the bits T0d . . . Tpd of the digital word Tx.

In the case in which the signal Dult is formed by the digital enabling signal En, the apparatus of FIG. 3 includes control circuits 5 and 20 constructed with an array of devices A1 . . . An. Each of the devices A1 . . . Ap of the control circuit 5 includes a port AND receiving in input the enabling signal DAC_EN and one of the bits S0d . . . Spd of the digital word Sx, while each of the devices Ap+1 . . . An of the control circuit 20 includes a port AND receiving in input the enabling signal EN and one of the bits Sp+1 . . . Snd of the digital word Sx (in the case in which the digital word Sx has n bits).

Figure 5:
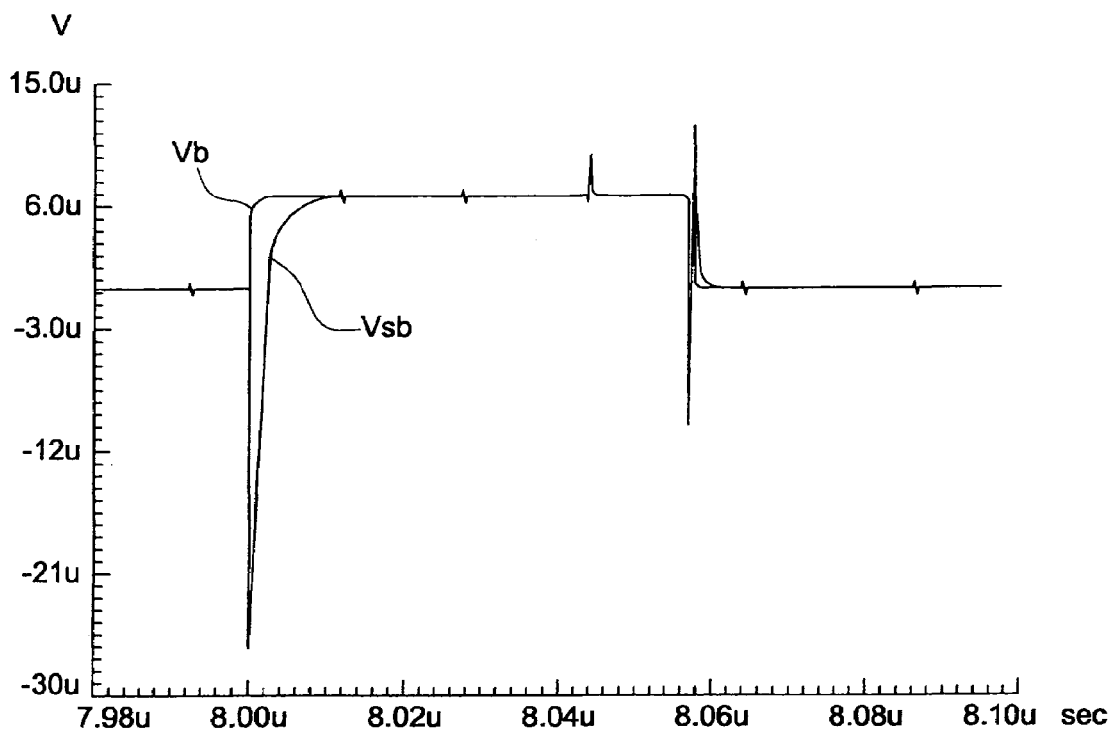
FIG. 5 is a diagram of the voltage in output from the apparatus of FIG. 2 with and without a buffer.

The current sources S1 . . . Sn are connected by means of a further array of switches T1 . . . Tn to a circuit line 200 in which the output current of the apparatus Idac is reserved when it is not used. The switches T1 . . . Tn are controlled by the control signals Cn1 . . . Cnn, which are the negated signals of the control signals C1 . . . Cn. The lines 2 and 200 are united by means of a buffer 100. This enables the switching speed to be improved and reduces the presence of current spikes caused by switchings. In fact in the known converters the circuit line 200 is connected to ground or to the supply voltage VCC; if, for example, PMOS transistors are used as switches SW1 . . . SWn and T1 . . . Tn, the switching time of every transistor T1 . . . Tn is greater than the switching time of the respective transistor SW1 . . . SWn because every transistor T1 . . . Tn needs more time to exit the cut-off zone (has a higher voltage between source and drain than the respective transistor SW1 . . . SWn). With the use of the buffer 100 the drain terminal of every transistor T1 . . . Tn and of the respective transistor SW1 . . . SWn are always kept at the same voltage. The results of simulations made on the apparatus of FIG. 2 with the use of the buffer 100 and without the use of the buffer 100 is shown in FIG. 5. It can be seen that the voltage signal Vb (voltage signal in output from the apparatus with buffer 100) has less spikes than the voltage signal Vsb (voltage signal in output from the apparatus without the use of the buffer 100). In particular the buffer 100 is formed by an operational amplifier having the inverting terminal connected with its own output terminal; the buffer 100 has the non-inverting terminal connected to the output line 2 and the output terminal connected with the circuit line 200. The signals Vb and Vsb are given by the current Idac in output for a resistive load.

It is also possible to add a source current Icompl connected to the output line 2 of the apparatus to have the possibility of changing the central value of the field of total variation of the current of the apparatus. The current source is connected between the line 2 and ground.

Figure 4:
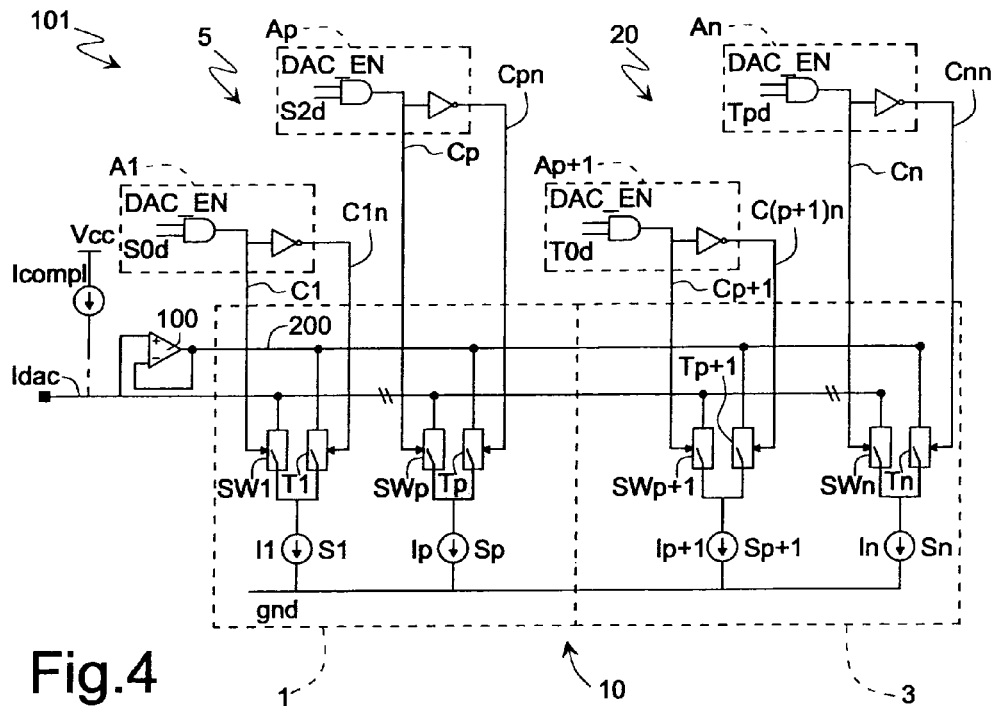
FIG. 4 is a circuit diagram of an apparatus for the digital-analog conversion of a signal in accordance with a variation of the embodiment of the present invention shown in FIG. 2.

In FIG. 4 a variation of the first embodiment of the invention is shown. The variation can also be carried out for the apparatus of FIG. 3. Two of the differences of the apparatus of FIG. 4 in comparison to the apparatus of FIG. 2 consist in the connection to ground of the current sources S1 . . Sn instead of the supply voltage Vcc, and in the connection to ground of the additional current generator Icompl instead of the voltage Vcc.

Figure 6:
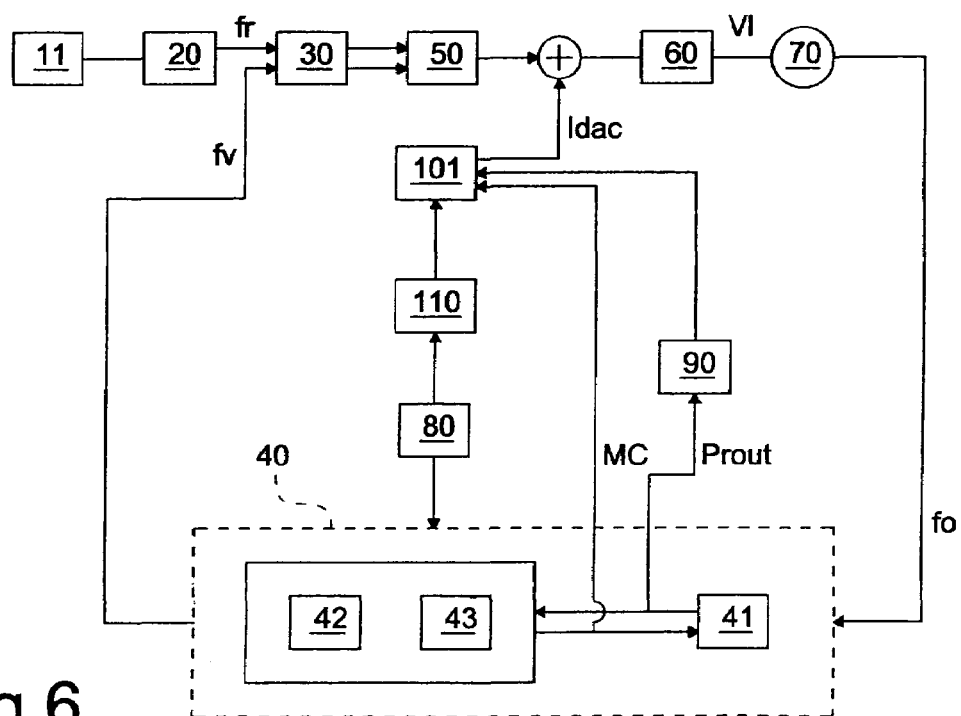
FIG. 6 is a block diagram of an application of the apparatus of FIG. 1.

A particular application of the apparatus of FIG. 1 is a phase-locked loop (PLL) shown in FIG. 6. The phase-locked loop has an oscillator 11, a phase detector 30 having in input a signal fr proportional to the signal in output from the oscillator 11 and obtained by means of a reference divider 20, a charge pump 50 having in input the signal in output from the phase detector 30, a filter 60 coupled with the charge pump 50, a voltage controlled oscillator 70 and a fractional frequency divider 40. The voltage controlled oscillator 70 is coupled with the filter 60 and sends an output signal fo to the fractional frequency divider 40. The fractional frequency divider 40 is suitable for sending an output signal fv to the phase detector 30. The phase-locked loop comprises the digital-analog converter 101 of FIG. 1 coupled with the charge pump 50 and with the filter 60, an accumulator 80 coupled with the fractional frequency divider 40 and with the digital-analog converter 101.

The phase-locked loop 40 has a prescaler 41 suitable for dividing the input signal fo by an integer number P+1, and the fractional frequency divider 40 emits a first representative signal MC of the division by P or by P+1 of the prescaler 41. The first signal MC is in input to the digital-analog converter 101 so that the signal Idac in output from the digital-analog converter 101 depends on the first signal MC. The phase-locked loop includes a circuitry 90 coupled to the digital-analog converter 101 and the prescaler 41 to synchronize the signal Idac in output from the digital-analog converter 101 with the output signal Prout at the prescaler 41. A delay circuit 110 is also positioned between the accumulator 80 and the converter 101. The signal MC is the signal Dult of FIG. 1 in the case in which the same digital signal Dult is formed by the enabling signal En.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims and the equivalents thereof.

The invention claimed is:

1. An apparatus for converting a digital input signal into an analog output signal, comprising:
   first circuit means for receiving the digital input signal that is representative of the analog output signal and suitable for producing a first signal on an output line;
   second circuit means for supplying a second signal on said output line in reply to a further digital signal, said further digital signal being a function of external variables, and a union of said first and said second signal on said output line forming said analog output signal; and
   wherein said first and second circuit means each comprise at least one array of current sources that produce respective output currents, an array of switches that are connected to switch the respective outputs of said current sources towards said output line in response to respective control signals so as to supply said first output signal on said output line, control means having said digital input signal that is representative of the analog output signal and suitable for sending several of said control signals to respective several of said switches for producing said first output signal, and further control means suitable for producing control signals to the remaining switches of said array of switches in response to said further digital signal.

2. The apparatus of claim 1 wherein said further digital signal is an enabling signal.

3. The apparatus of claim 1 wherein said further digital signal is a correction signal.

4. The apparatus of claim 2 wherein said further control means have said digital signal in input.

5. The apparatus of claim 3 wherein said further control means have the same enabling signal of said control means in input.

6. The apparatus of claim 1, further comprising a further circuit line and a further array of switches that are connected to switch the respective outputs of said current sources towards said further circuit line in reply to the negated signals of said respective control signals, and a buffer coupled between said further circuit line and said output line.

7. The apparatus of claim 1, further comprising a circuit having said external variables in input and suitable for generating said further digital signal.

8. A circuit, comprising:
   a first circuit having an input to receive a digital input signal and configured to generate a first output signal on an output line;
   a second circuit having an input to receive a further digital signal and to generate a second output signal on the output line in combination with the first output signal, the second circuit receiving the digital input signal on a second input; and
   a third circuit having an input to receive at least one variable signal and to generate the further digital signal.

9. The circuit of claim 8 wherein the first circuit comprises a plurality of first current sources and the second circuit comprises a plurality of second current sources, and further comprising a control circuit configured to generate first control signals to the first current sources to generate the first output signal and to generate second control signals to the second current sources to generate the second output signal that modifies the first output signal to provide a combined output signal.

10. The circuit of claim 9 wherein the combined output signal is an analog signal.

11. The circuit of claim 10 wherein the control circuit receives the digital input signal on a first input and generates the first and second control signals in response thereto.

12. The circuit of claim 9 wherein the second control signals comprise negated signals of the first control signals.

13. The circuit of claim 9 wherein the control circuit is configured to receive one of either a digital correction signal or a digital enabling signal and to generate the first and second control signals in response thereto.

14. The circuit of claim 9 wherein the first circuit comprises a plurality of first switches coupled between respective current sources and the output of the first circuit and a plurality of second switches coupled between the respective current sources and the output of the first circuit and in parallel with a respective first switches, each of the first and second switches having a control terminal to receive the first control signals; and the second circuit comprises a plurality of first switches coupled between the respective current sources and the output of the second circuit and a plurality of second switches coupled between the respective current sources and the output of the second circuit and in parallel with the respective first switches, the plurality of first and second switches in the second circuit having control terminals to receive the second control signals.

15. The circuit of claim 14 wherein a switching time of the second switches in the first and second circuits is greater than a switching time of the respective first switches in the first and second circuits.

16. A phase-locked loop circuit, comprising:
an oscillator coupled to a phase detector that in turn is coupled to a charge pump, a voltage controlled oscillator coupled to a filter that in turn is coupled to the output of the charge pump;
a fractional frequency divider coupled to the voltage controlled oscillator and the phase detector; and
an digital-analog converter coupled to the charge pump, the filter, and to the fractional frequency divider, the digital-analog converter comprising:
a first circuit having an input to receive a digital input signal and configured to generate a first output signal on an output line;
a second circuit having an input to receive a further digital signal and to generate a second output signal on the output line in combination with the first output signal; and
a third circuit having an input to receive at least one external signal and to generate the further digital signal.

17. The phase-locked loop circuit of claim 16, further comprising a plurality of first current sources coupled to the first circuit and a plurality of second current sources coupled to the second circuit, and further comprising a control circuit configured to generate first control signals to the first current sources to generate the first output signal and to generate second control signals to the second current sources to generate the second output signal that modifies the first output signal to provide a combined output signal.

18. The phase-locked loop circuit of claim 17 wherein the first circuit comprises a plurality of first switches coupled between respective current sources and the output of the first circuit and a plurality of second switches coupled between the respective current sources and the output of the first circuit and in parallel with the respective first switches, each of the first and second switches having a control terminal to receive the first control signals; and the second circuit comprises a plurality of first switches coupled between the respective current sources and the output of the second circuit and a plurality of second switches coupled between the respective current sources and the output of the second circuit and in parallel with the respective first switches, the plurality of first and second switches in the second circuit having control terminals to receive the second control signals.

19. A circuit, comprising:
a first circuit having an input to receive a digital input signal and configured to generate a first output signal on an output line;
a second circuit having an input to receive a further digital signal and to generate a second output signal on the output line in combination with the first output signal;
a third circuit having an input to receive at least one variable signal and to generate the further digital signal; and
the first circuit comprises a plurality of first current sources and the second circuit comprises a plurality of second current sources, and further comprising a control circuit configured to generate first control signals to the first current sources to generate the first output signal and to generate second control signals to the second current sources to generate the second output signal that modifies the first output signal to provide a combined output signal.

20. The circuit of claim 19 wherein the second circuit receives the digital input signal on a second input.

21. The circuit of claim 19 wherein the combined output signal is an analog signal.

22. The circuit of claim 21 wherein the control circuit receives the digital input signal on a first input and generates the first and second control signals in response thereto.

23. The circuit of claim 19 wherein the second control signals comprise negated signals of the first control signals.

24. The circuit of claim 19 wherein the control circuit is configured to receive one of either a digital correction signal or a digital enabling signal and to generate the first and second control signals in response thereto.

25. The circuit of claim 19 wherein the first circuit comprises a plurality of first switches coupled between respective current sources and the output of the first circuit and a plurality of second switches coupled between the respective current sources and the output of the first circuit and in parallel with a respective first switches, each of the first and second switches having a control terminal to receive the first control signals; and the second circuit comprises a plurality of first switches coupled between the respective current sources and the output of the second circuit and a plurality of second switches coupled between the respective current sources and the output of the second circuit and in parallel with the respective first switches, the plurality of first and second switches in the second circuit having control terminals to receive the second control signals.

26. The circuit of claim 25 wherein a switching time of the second switches in the first and second circuits is greater than a switching time of the respective first switches in the first and second circuits.

* * * * *